(12) United States Patent
Wong et al.

(10) Patent No.: US 7,501,828 B1
(45) Date of Patent: Mar. 10, 2009

(54) SWITCHABLE BIRDCAGE COIL

(75) Inventors: Wai Ha Wong, San Jose, CA (US); Alan R. Rath, Fremont, CA (US); Steven A. Suddarth, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 12/004,150

(22) Filed: Dec. 19, 2007

(51) Int. Cl.
*G01V 3/00* (2006.01)
(52) U.S. Cl. .................................. 324/322; 324/318
(58) Field of Classification Search .......... 324/300–322; 600/407–445; 29/602.1
See application file for complete search history.

(56) References Cited

U.S. PATENT DOCUMENTS

| | | | |
|---|---|---|---|
| 2,246,696 A * | 6/1941 | Reid | 331/170 |
| 4,359,764 A * | 11/1982 | Block | 361/119 |
| 4,689,548 A | 8/1987 | Mechlenburg | |
| 4,694,255 A | 9/1987 | Hayes | |
| 4,833,409 A | 5/1989 | Eash | |
| 4,992,919 A * | 2/1991 | Lee et al. | 363/17 |
| 7,180,291 B2 * | 2/2007 | Chmielewski et al. | 324/318 |
| 2008/0275332 A1 * | 11/2008 | Alradady et al. | 600/422 |

* cited by examiner

*Primary Examiner*—Brij B Shrivastav
(74) *Attorney, Agent, or Firm*—Bella Fishman

(57) ABSTRACT

A switchable birdcage coil functioning as a transmitter coil and a separate RF surface coil functioning as the receiver coil are utilize in NMR and MRI apparatus. To prevent the switchable birdcage coil from absorbing energy by coupling to the receiver coil or by absorbing power from the RF field produced by the precessing nuclear spins, one or more of the reactive elements of the birdcage coil are switched from a normal reactive impedance state to a high impedance state. The high impedance state is formed by switchably combining the reactive element with a complementary reactive element thereby forming parallel resonant high impedance circuit that is tuned to resonate at the NMR frequency.

15 Claims, 4 Drawing Sheets

SWITCHABLE BIRDCAGE COIL

FIELD OF THE INVENTION

The invention is in the field of magnetic resonance imaging (MRI) using nuclear magnetic resonance (NMR) phenomenon and relates to the use of an actively switchable birdcage coil providing better signal-to-noise ratio.

BACKGROUND OF THE INVENTION

Birdcage coils are commonly used in NMR and MRI instrumentation to produce the RF field over the sample or the object being imaged. The birdcage coils are described, for example, in the U.S. Pat. Nos. 4,689,548 and 4,694,255. The conventional birdcage coil consists of a number of evenly spaced leg conductive elements interconnecting a pair of ring conductive elements. Each conductive element includes at least one reactive element that may be a capacitive or inductive element. There are two basic designs of birdcage coils: high-pass birdcage coils having inductive leg elements and capacitive ring elements, and low-pass birdcage coils having capacitive leg elements and inductive ring elements. There are also "band pass" or hybrid versions that use a combination of capacitive and inductive elements as leg or ring elements.

Basically the birdcage coil is a linear network of identical cells connected together so that the last cell in a ring is connected to the first cell. From the spatial point of view, each cell comprises a pair of ring elements coupled to a leg element forming a "ladder" network. When excited by RF energy, waves propagate along the network. For some particular frequencies the waves combine constructively corresponding to the resonant modes of the network. For the resonance of interest, the phase of the current in each adjacent leg is shifted by an angle $\phi=2\pi/N$, and the amplitude of the current in each leg follows the cosine relationship:

$$I_n = I \cos(2\pi n/N),$$

where N is a number of cells and n=1, 2, ... N.

In a typical experiment one or more pulses of radio frequency (RF) magnetic field are applied to the sample or object in the probe to excite a nuclear resonance signal. This is followed by a reception period where the transmitter is silent and the receiver is activated to detect and record any response signal produced by the nuclei. In some systems the same coil or resonator is used to produce the transmit RF magnetic field and to receive the response signal of the nuclei. In other systems including the systems described here, a birdcage coil is used to excite a nuclear resonance signal and a separate coil or coils are used to detect the response signal produced by the nuclei. Residual coupling between the transmitter and receiver coils reduces the sensitivity during the receive mode. The small NMR currents in the receiver coil windings induce currents in the transmitter coil windings causing a loss in sensitivity since the power is absorbed and not available for signal detection. Direct coupling of the RF fields produced by the nuclei also induce currents in the transmitter coil causing a loss in sensitivity.

In attempt to solve the problem switching diodes were utilized to detune or disable the transmit or body coil in MRI as disclosed in the U.S. Pat. No. 4,763,076. The diodes were connected in series with the transmitter coil and must be forward biased during the transmit mode. When the diodes were forward biased by a DC current flowing from an anode to a cathode, the diodes provided a path for the RF currents. The diodes were reverse biased to detune or disable the transmitter circuit. A reverse biased diode provides RF signal isolation between its anode and cathode. Radio frequency choke coils or traps may be used in the lines for conducting the DC current to the switching diode and preventing RF currents from flowing on the lines.

A birdcage coil described in the U.S. Pat. No. 4,833,409 comprises a circuit for dynamically disabling it to allow for localized coil to receive the NMR signals. Each end ring of the birdcage coil is coupled to a shield surrounding the birdcage coil by four switchable impedance circuits equidistantly spaced around each end ring. When activated, the circuit provides a low impedance path between the coil and ground. This detunes the cells that are coupled to the impedance switch thereby affecting the tuning of the birdcage resonator. Though the tuning of the four cells that are coupled to the switch elements are affected, and the birdcage coil as a whole would no longer produce a resonance, currents are still induced in the individual cell inductive elements. In spite of the fact that these currents are not in a circuit that resonates at the NMR frequency, voltages are still induced in the loops and the resulting currents are smaller, but not zero or near zero because of the still finite impedance of the cell elements at the NMR frequency.

SUMMARY OF THE INVENTION

A birdcage coil of the present disclosure is used to produce the transmitter RF magnetic field over the sample and addresses the prior art problems by blocking essentially all residual currents that arise from any RF voltage that may be induced into its cells. The birdcage coil comprises a plurality of identical cells connected there between in a ladder pattern. Each cell has an upper ring reactive element, a lower ring reactive element, and a leg reactive element interconnecting reactive elements the upper and lower rings respectively. The reactive elements of one or more cells are connected to a complementary reactive element forming a parallel resonant circuit therewith. The parallel resonant circuit is coupled to PIN diodes for switching between a transmit and a receive modes of operations and tuned to a frequency of the NMR signals. The birdcage coil may have high-pass, low-pass or hybrid configurations.

BRIEF DESCRIPTION OF THE DRAWINGS

The foregoing aspects of the present invention will become better understood from the following detailed description with reference to the drawings in which.

Figure 1:
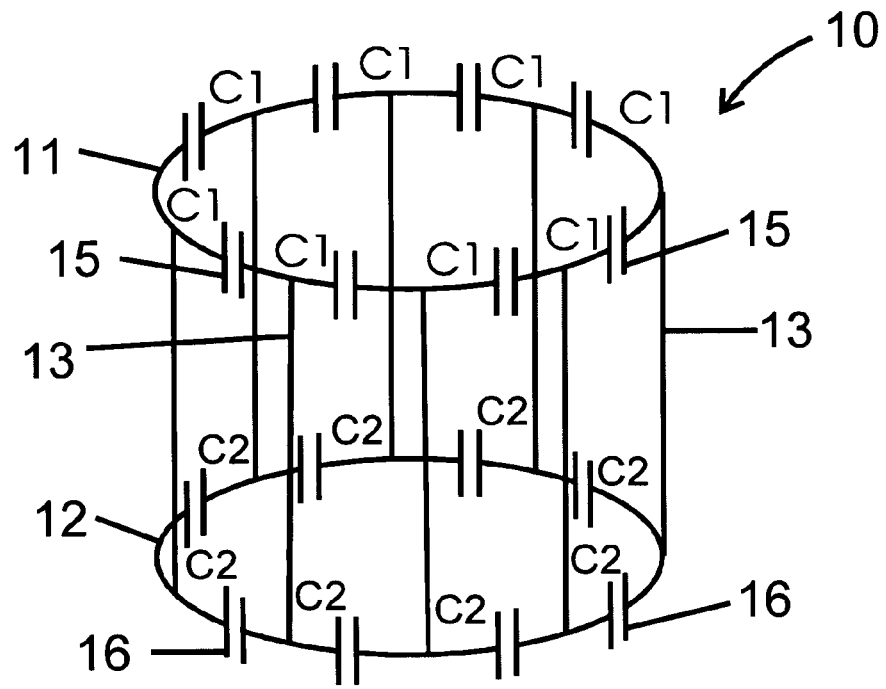
FIG. 1 is a schematic diagram of a prior art high-pass birdcage coil.

The items in the drawings are labeled as follows:

| Item | Component | Value (when applicable) |
|---|---|---|
| 10 | Birdcage coil (high-pass birdcage coil) | |
| 11 | Upper ring | |
| 12 | Lower ring | |
| 13 | Leg inductors | L1 |
| 15 | Ring capacitor | C1 |
| 16 | Ring Capacitor | C2 |
| 20 | Electrical network (high-pass birdcage coil) | |
| 30 | Simplified circuit | |
| 31 | Inductor | L2 |
| 40 | Circuit diagram (switchable high-pass birdcage coil) | |
| 44 | PIN diode | |
| 45 | Source terminal | |
| 46 | Bias supply | |
| 47 | Return terminal | |
| 48 | RF choke coil | L3 |
| 49 | RF choke coil | L4 |
| 50 | Switchable birdcage coil | |
| 51 | Switchable birdcage coil | |
| 55 | RF choke coil | L3 |
| 60 | Switchable birdcage coil (Low-pass birdcage coil circuit) | |
| 61 | Upper ring | |
| 62 | Lower ring | |
| 63 | Leg capacitor | C3 |
| 64 | PIN diode | |
| 65 | Inductor | L5 |
| 66 | Inductor | L6 |
| 67 | RF choke coil | L4 |
| 68 | RF choke coil | L3 |

DESCRIPTION OF THE PREFERRED EMBODIMENTS

Figure 2:
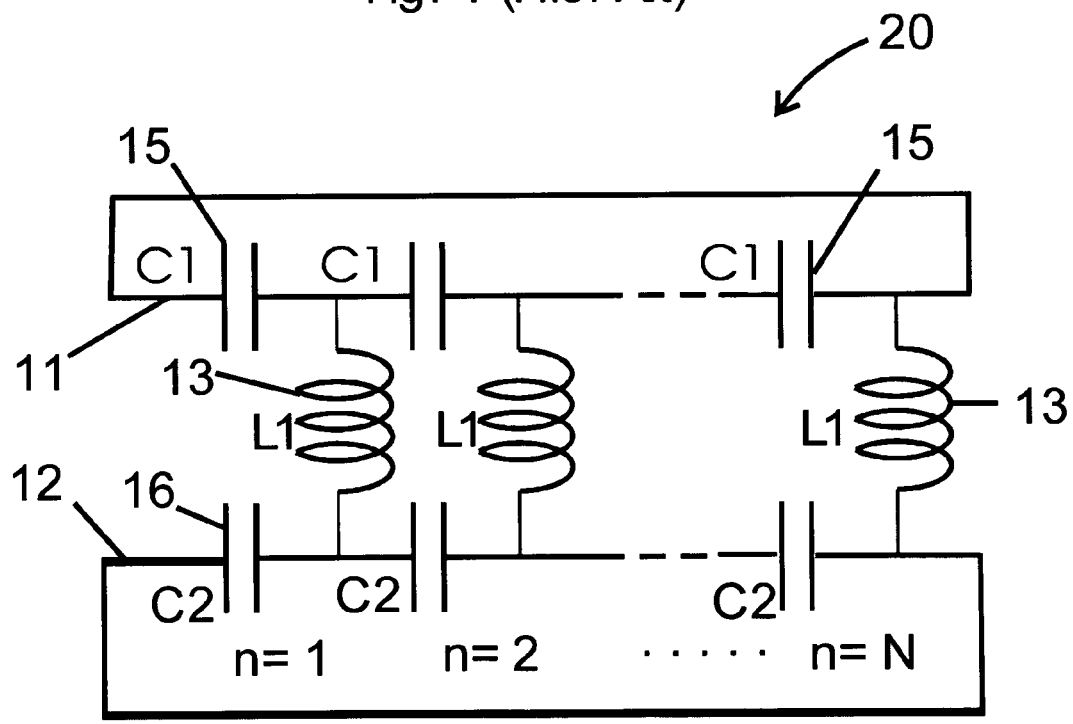
FIG. 2 is a circuit diagram of a prior art high-pass birdcage coil.

Turning toward the drawings, FIG. 1 is a diagram of a prior art high-pass birdcage coil. Birdcage coil 10 comprises upper ring 11 and lower ring 12, each with N equally spaced capacitors around a respective ring. Upper ring capacitors 15, each has a capacitance value C1, and the low ring capacitors 16, each has a capacitance value C2. Leg inductors 13 have an inductance value L1 and are extended between each pair of the upper ring capacitors and a corresponding pair of the low ring capacitors. The birdcage coil is formed as a linear network of cells. In each cell an upper ring capacitor 15 is connected to one end of a leg inductor 13, and a low ring capacitor 16 is connected to the other end of the same leg inductor 13. These elements are coupled together to form an electrical network 20 as illustrated in FIG. 2. The birdcage coil is resonant at frequencies where the total phase shift of currents around the network combine constructively, i.e. where the total phase shift around the network is a integer multiple of $2\pi$. The normally used resonance occurs when the phase shift around the network is exactly $2\pi$.

According to the teaching of the U.S. Pat. No. 4,833,409 eight switchable impedance circuits are provided to achieve a partial reduction of the currents induced in a birdcage coil. Each switchable impedance circuit is controlled by the application of a forward or reverse bias on the PIN diode. With a forward bias current the impedance of the diode is low, and with reverse bias it is high. The switchable impedance circuits are coupled to the birdcage coil at four equidistant points around a top ring and ground, and four equidistant points around a bottom ring and ground. When the switchable impedance circuit is in a low impedance state, the birdcage coil is effectively grounded at four points around the top ring and four points around the bottom ring. Though the overall resonance response of the birdcage coil is reduced, currents are still induced in each of these grounded inductive sections and represent a loss. The value of the current I is:

$I = V/(\omega L1)$, where

V is the induced voltage, $\omega L1$ is the impedance of the coil, $\omega$ is the NMR frequency, L1 is the inductance of the cell.

Figure 3:
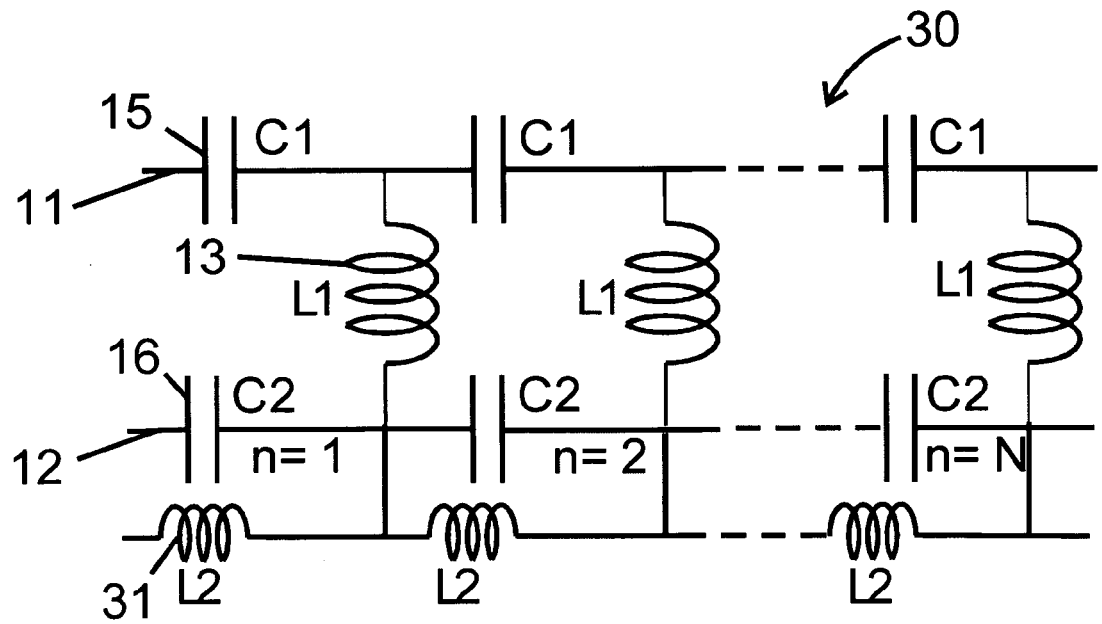
FIG. 3 is a simplified circuit diagram illustrating a general feature of the switchable birdcage coil of the present invention when the circuit is activated.

The advantage of the present work over the prior art is illustrated by FIG. 3 showing the features of the first embodiment. It is understood (though not shown) that the network is closed: the last cell n=N is connected to the first cell n=1 in a way as shown in FIG. 2. Simplified circuit 30 shown in FIG. 3 illustrates the network configuration of one embodiment switching is activated during the receive mode thereby putting the birdcage coil in the receive mode. Inductors 31, each having an inductance L2, are switched to be in parallel with the ring capacitors 16 each having capacitances C2. The values of L2 and C2 are chosen to resonate at the NMR frequency $\omega$, i.e. $L2C2=\omega^{-2}$. The impedance of the parallel combination of L2 and C2 is very high at the NMR frequency. The value of the impedance at resonance is $\omega L2Q2$, where Q2 is the quality factor of inductor 31 with inductance L2 at the NMR frequency. The value of current, I1, induced in leg inductors 13 is equals approximately to $V/(\omega L2Q2)$. The ratio of the current I1 induced in leg inductor of the present embodiment to the current value I of the prior art (U.S. Pat. No. 4,833,409) is: $I1/I=L1/(QL2)$. The value of inductances L2 is expected to be comparable or larger than the value of inductance L1. The quality factor Q2 typically is greater than 50 so that the decrease of current through L1 when the switch of the present embodiment is activated is a factor of 50 or more. At the end of the transmit period the switch is deactivated and the birdcage coil of the present embodiment functions as electrical network 20 shown in FIG. 2.

Figure 4:
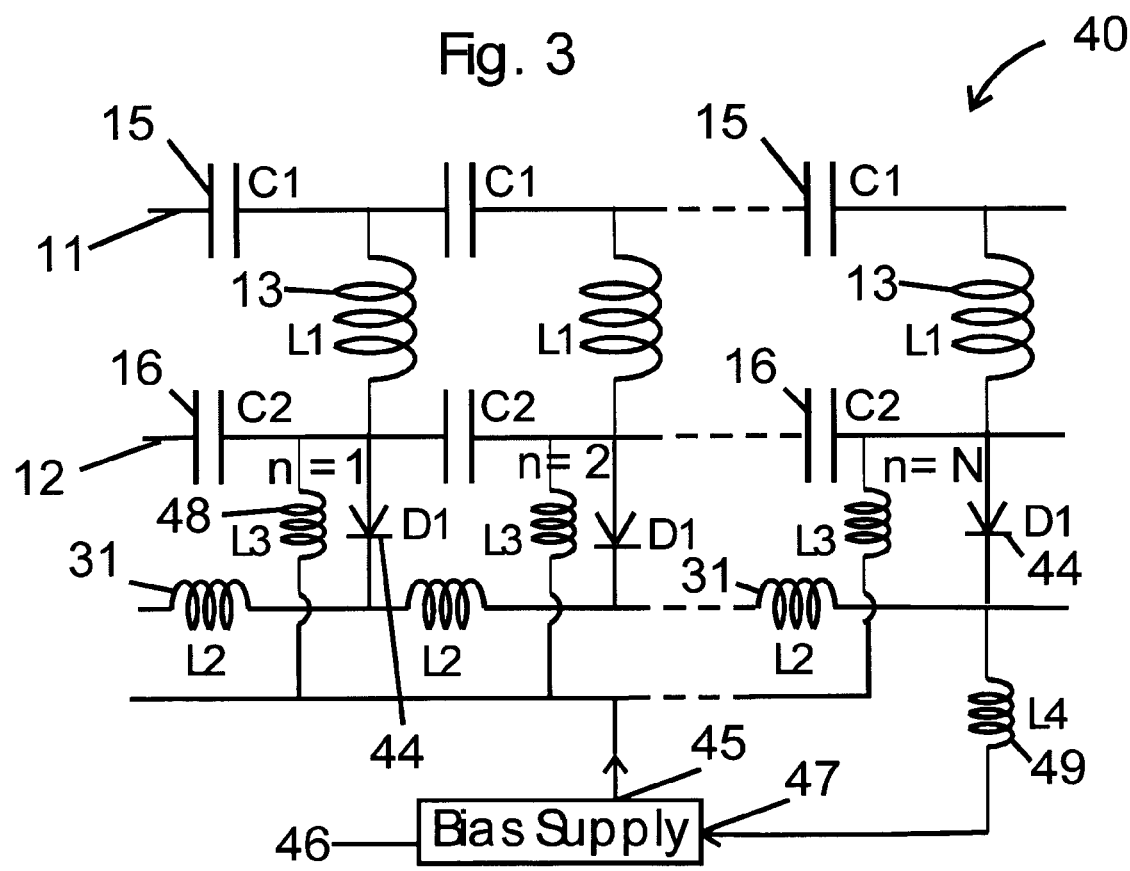
FIG. 4 is a circuit diagram of first embodiment of the switchable birdcage coil.

FIG. 4 is a circuit diagram of a high-pass birdcage coil implementing switch activating features noted in connection with the description of FIG. 3. The high-pass birdcage coil comprises the upper ring 11 with ring capacitors values C1 and the lower ring 12 with ring capacitors values C2 and leg inductors 13 with inductance values L1. PIN diode 44 is a switching diode, for example the MP4P7461F-1072T manufactured by Tyco Electronics, USA. This is a non-magnetic diode, which operates in high magnetic fields without perturbing the magnetic field homogeneity. A forward voltage (anode of PIN diode is positive with respect to the cathode) of 1 volt produces a forward current of 100 ma and a series resistance of 0.1 ohm at 100 MHz. A reverse voltage of 1 volt produces a parallel resistance of 30,000 ohms. As shown in FIG. 4, the PIN diodes 44 are controlled by bias supply 46, furnishing approximately +1 volt between source terminal 45 and return terminal 47 to activate the switch to a low resistance state, and -1 volt to deactivate the switch to a high resistance state. The source terminal 45 is coupled by RF choke coils 48 to the anodes of PIN diodes 44 and the cathode of the PIN diodes are coupled to the return terminal 47 of bias supply 46 by RF choke coil 49 and, in some modifications of the embodiment, through one or more inductors 31. The RF choke coils 48 and 49 are low resistance inductors, which block radio frequency current while passing direct current and couple the bias supply 46 to the PIN diodes 44. Since the RF choke coils have sufficiently high impedance at RF frequencies so they do not perturb the RF operations of the birdcage coil.

During the transmit mode, bias supply applies a zero or negative voltage between source terminal 45 and return terminal 47, deactivating PIN diodes 44 to their high parallel resistance or non-conductive state, essentially isolating inductors 31 from capacitors 16. Even with the large RF voltages that may appear during the transmit phase, only one of the diodes of each diode pair between an inductor 31 and its corresponding capacitor 16 is reverse biased by any RF voltage induced in inductor 31, so that one of the diodes is in non-conducting stage preventing any current flow in inductors 31 during the transmit phase. This circuit configuration prevents transmit RF voltage peaks form activating both diodes of a pair simultaneously. When the RF voltage switches ON one diode of the pair, the other is switched OFF even when the bias supply is applying a small or zero voltage to the diode. During the transmit mode, the RF operation of birdcage coil 40 of FIG. 4 is similar to the birdcage coil presented by the electrical network 20 of FIG. 2.

The transmit mode is followed by a receive mode where the transmitter is silent and receiver is activated. A surface coil is used to receive the NMR response of the sample or object. The surface coil is placed very close to the sample of region of the object to obtain maximum sensitivity. It is desirable to minimize the coupling between the transmitter coil and surface receiver coil. During the receive mode the small NMR currents in the receiver coil windings induce currents in the transmitter coil windings causing a loss in sensitivity as the power is absorbed and not available for signal detection. Additionally during the receive mode, any RF magnetic flux through the windings of the birdcage coil that arise from the nuclei as well as from coupling with the surface coil will induce a voltage in the windings of the birdcage coil. To the extent that this induced voltage produces a current in the windings, a loss in signal power takes place. To minimize this loss it is desired that the impedance in series with this voltage be as high as possible.

To maximize this series impedance during the receive mode, bias supply 46 is activated to apply a positive voltage between source terminal 45 and return terminal 47 producing a forward bias voltage to the PIN diodes 44 causing them to exhibit a low series resistance thereby coupling inductors 31 to ring capacitors 16 forming parallel resonant circuits. As mentioned above these parallel resonant circuits are tuned to resonate at the NMR frequency ω and exhibit high impedance at this frequency. During this phase of operation, the simplified circuit 30 of FIG. 3 illustrates the RF operation of circuit 40 of FIG. 4 with the birdcage coil switched to its passive mode.

Figure 5A:
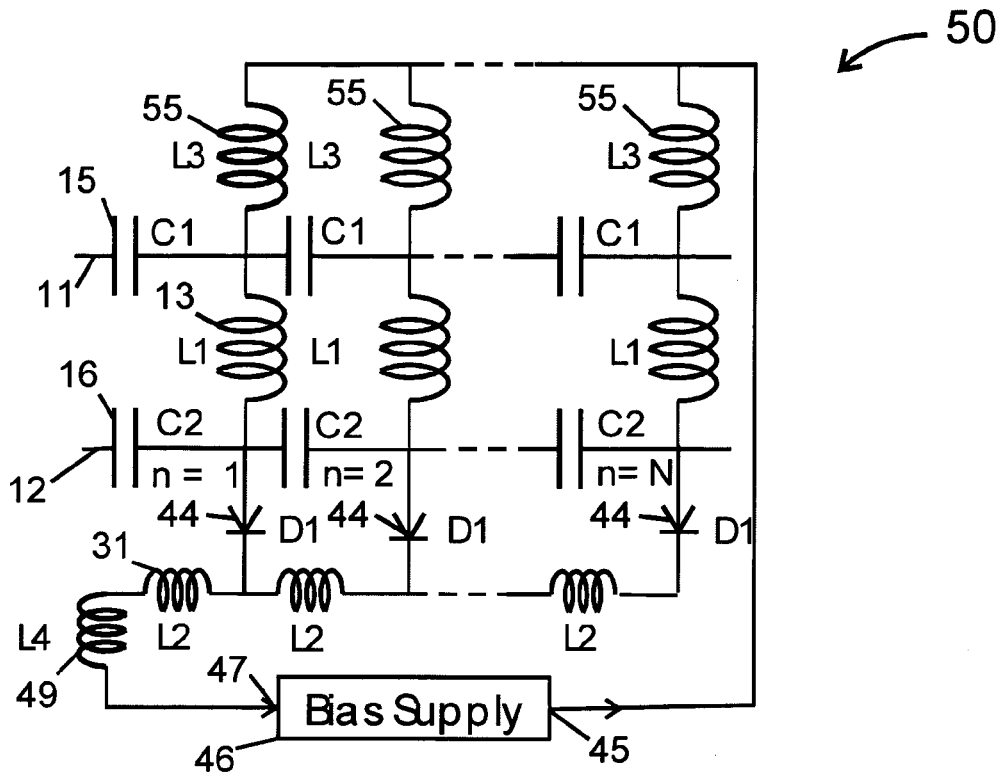
FIG. 5A is a circuit diagram of an alternative embodiment of the switchable birdcage coil.

The circuit of FIG. 5A shows yet another embodiment of the switchable birdcage coil 50. The high pass birdcage coil comprise the ring capacitors 15 with values C1 in the upper ring 11, capacitors 16 with values C2 in the lower ring 12 and leg inductors 13 with inductance values L1. RF choke coils 55 with inductance L3 and RF choke coil 49 with inductance L4 have a low DC resistance as do leg inductors 13 and inductor 31 thereby enabling secure connection of bias supply 46 to PIN diodes 44. When switchable birdcage coil 50 of FIG. 5A is activated by a +1V between source terminal 45 and return terminal 47 of bias supply 46, PIN diodes 44 switch to a low resistance state thereby connecting inductors 31 across capacitors ring 16 forming parallel resonant circuits. The resonant frequency of these circuits is tuned to the NMR frequency providing a high impedance to be in series with leg inductors 13 thereby greatly reducing any residual currents caused by its coupling with surface coils or by direct coupling to the NMR nuclei. The PIN diodes 44 are activated to their conductive state by a current produced by a positive voltage on active terminal 45 of bias supply 46. The current flows from source terminal 45 through RF choke coils 55 and leg inductors 13 to the anodes of PIN diodes 44 and continues from the cathodes through RF choke coil 49 to return terminal 47 of bias supply 46. The current return path for some of the diodes may include one or more inductors 31.

During the transmit mode of the experiment the diodes are switched off by a zero or negative voltage on the source terminal 45 of bias supply 46. Even though large RF currents may flow through the high pass birdcage coil, when the RF voltage across one diode of a pair turns it ON, the voltage across the other diode member of the pair is in the opposite direction and turns it OFF, thereby preventing both diodes being ON simultaneously to form a parallel resonant circuit. The RF choke coils 49 and 55 have sufficient inductance and low stray capacitance that their impedance is sufficiently high so they do not appreciably disturb the RF operation of the birdcage coil.

Figure 5B:
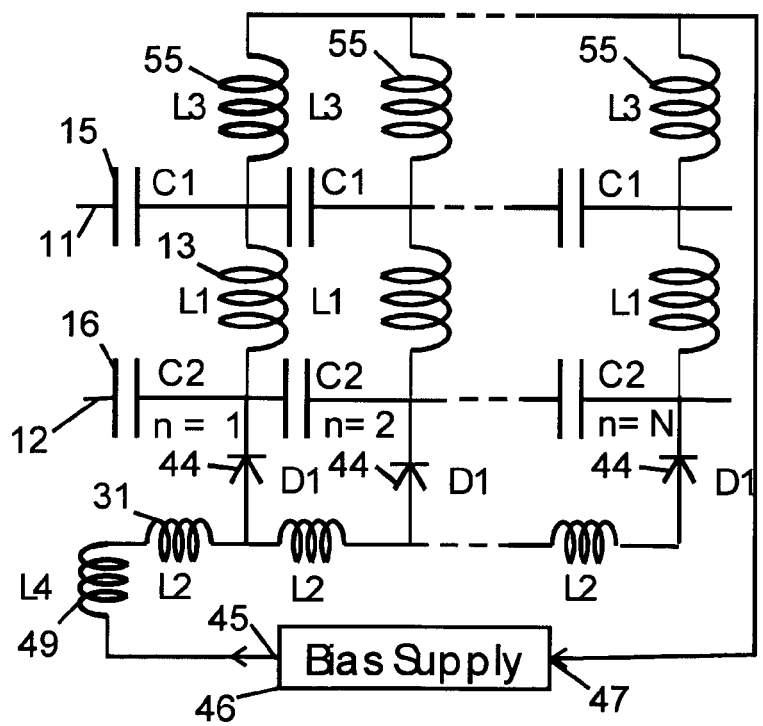
FIG. 5B is a circuit diagram of the embodiment of FIG. 5A with reversed polarity of the PIN diodes and their connections to the bias supply.

Switchable birdcage coil 51 shown in FIG. 5B is similar to switchable birdcage coil 50 of FIG. 5A; however the difference is in the polarity of diodes. PIN diodes of switchable birdcage coil 51 have the reversed polarity in comparison to the switchable birdcage 50. Source terminal 45 is still DC coupled to the anodes of PIN diodes 44 and the cathodes of PIN are connected to return terminal 47 of bias supply 46.

A precaution to be observed in circuit layout of the circuits of FIG. 4, FIGS. 5A and 5B is that the resonant circuits formed by a parallel combination of capacitor 16 and inductor 31 coupled together by two diodes 44 form a closed loop. It is important that the area of this loop be made as small as possible or oriented to prevent it from trapping RF magnetic flux from the precessing nuclei or by coupling to the surface coil used for receiving the NMR signals.

Figure 6:
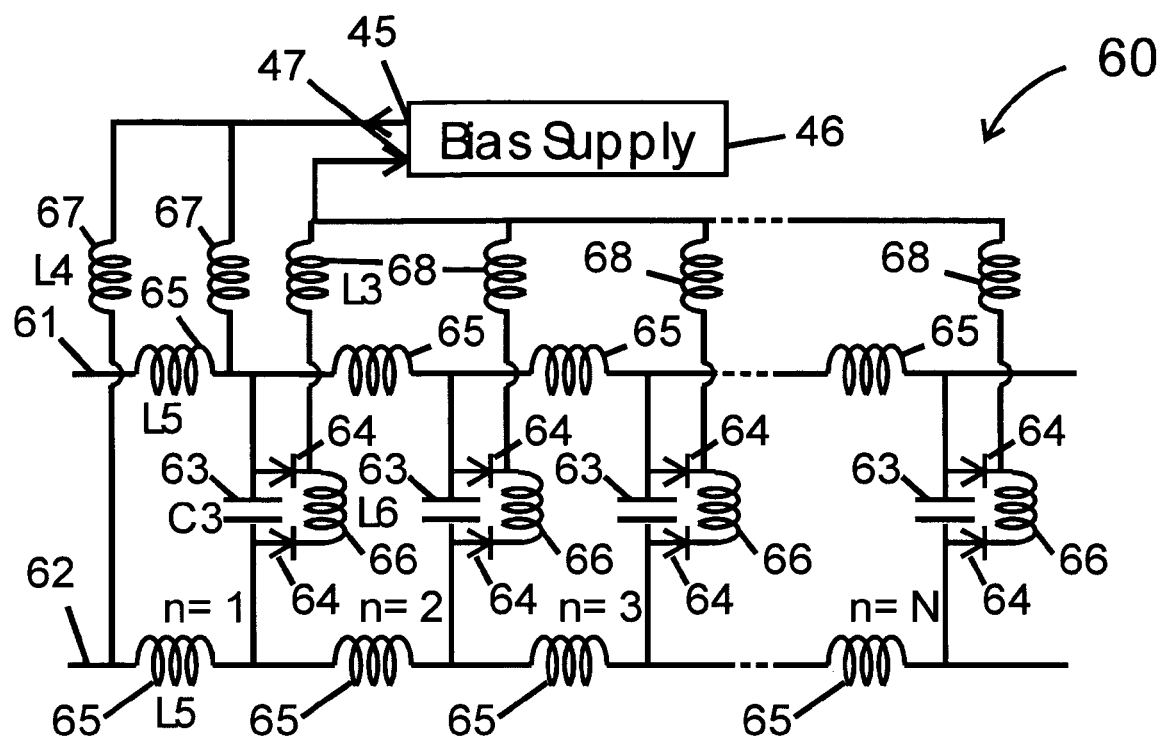
FIG. 6 is a circuit diagram of yet another embodiment of the present invention.

Switchable birdcage coil 60 shown in FIG. 6 is yet another embodiment of the invention, where a switchable low-pass birdcage coil is used as the transmitter coil and a surface coil or array is used to detect the NMR response. The switchable birdcage coil 60 is actively switched to a receive mode during the receive mode of the experiment thereby preventing it from absorbing energy by coupling to the surface coil or directly to the NMR response of the nuclei. A conventional low-pass birdcage coil comprises an upper ring 61 and a lower ring 62, each with N equally spaced inductors 65 around each ring. The inductors in both rings have the same inductance values, L5. Leg capacitors 63 have a capacitance value C3.

According to the present invention, the switchable low-pass birdcage circuit 60 includes PIN diodes 64, inductors 66, RF choke coils 67 and 68, and bias supply 46. During the receive mode, the PIN diodes 64 are switched ON to their conductive state, coupling inductors 66 to their adjacent leg capacitors 63 thereby forming a parallel resonant circuit. The resonant frequency of the circuit is tuned to the NMR frequency, the parallel resonant circuit forms a very high impedance thereby greatly reducing the circulating current between the upper and lower inductive rings. The diodes are switched on by passing a current from the source terminal 45 of bias supply 46 through RF choke coils 67 and possibly one or more ring inductors 65 onto the anodes of PIN diodes 64. The current passes through the diode, turning it to a conductive state, and out the cathode and back to the return terminal 47 of bias supply 46. In this process the current also passes through RF choke coils 68 and, possibly, through inductor 66. The resonant circuit formed by the parallel combination of leg capacitor 63, with capacity C3, and inductor 66, with inductance L6, resonates at the NMR frequency ω. The inductance L6 is selected to satisfy the resonance equation $L_6 C_3 = \omega^{-2}$. In this mode of operation the upper ring 61 and the lower ring 62 are decoupled from each other by the high parallel impedance of the resonant circuit thereby greatly reducing any currents in the cells produced by their coupling to the surface coils or directly to the NMR nuclei.

During the transmit period, the low-pass birdcage coil is in the transmit mode and bias supply 46 applies a zero or negative voltage on active terminal 45. Terminal 45 is connected to the anodes of the PIN diodes 64 through RF choke coils 67, and one or more ring inductors 65 thereby causing the diodes to become non-conducting. The cathode of PIN diodes is connected to the return terminal 47 of bias supply 46 through RF choke coil 68 and for one diode of the pair the return path includes inductor 66. Even though large RF currents may flow through the low pass birdcage coil, when the RF voltage across one diode of a pair turns it ON, the voltage across the other diode member of the pair is in the opposite direction and turns it OFF, thereby preventing both diodes being on simultaneously and forming a parallel resonant circuit.

A precaution to be observed in circuit layout of the circuit of FIG. 6 is that the resonant circuits formed by the parallel combination of leg capacitor 63 and inductor 66 when coupled together by the two diodes 64 form a closed loop. It is important that the area of this loop be made as small as possible or oriented to prevent it from trapping RF magnetic flux from the precessing nuclei or by coupling to the surface coil used for receiving the NMR signals.

Although the invention has been described herein in its preferred form, those skilled in the art will recognize that many changes and variations may be made thereto without departing from the spirit and scope of the invention as defined in the claims. For example other types of diodes other than PIN diodes way be used to perform the switching, and in some circuits transistors or integrated circuits may be used. It is also noted, that though the invention has been illustrated by the exemplary embodiments, where a switching of one reactive component in each rung from its normal impedance to a high impedance state was provided by forming a parallel resonant circuit that resonates at the NMR frequency, it would be obvious to those skilled in the art that it may not be necessary to apply this switching to every rung of the birdcage coil. In many systems sufficient reduction of losses may be obtained by providing the switching to less than to every rung.

Although the invention has been illustrated with a high pass and a low pass birdcage coils, it may also be used in band pass or hybrid versions of birdcage coils that use combinations of capacitive and inductive elements as leg or ring elements.

What is claimed is:

1. An NMR birdcage coil switchably operating in a transmit and a receive modes comprising:
    a plurality of identical cells connected in a ladder pattern, each cell having an upper and a low ring reactive elements interconnected therebetween by a leg reactive element, and
    a complementary reactive element having leads switchably connecting to said reactive elements of one or more cells and forming a parallel resonant circuit therewith for switching said reactive elements from a normal reactive impedance state to a higher impedance state during the receive mode of operations.

2. The NMR birdcage coil of claim 1, wherein said complementary reactive element is tuned to resonate at NMR frequency.

3. The NMR birdcage coil of claim 1, further comprising switch circuit comprising:
    PIN diodes electrically coupling each said lead of said complementary reactive element to one of said reactive elements of said one or more cells;
    a swithable DC voltage bias supply; and
    RF choke coils coupling said PIN diodes to said bias supply and providing RF frequency isolation between said complementary reactive element or elements and said bias supply, wherein said PIN diodes is switched by switching voltage polarity of said bias supply between electrically non-conducting and conducting states of said PIN diodes resulting in switching said NMR birdcage coil from the transmit to the receive mode.

4. The NMR birdcage coil of claim 1, further comprising:
    an upper ring formed by a first number of spaced apart and connected in series said upper ring reactive elements being capacitor elements, each having a first capacitance value;
    a lower ring formed by a second number being equal to said first number of spaced apart and connected in series said low ring reactive element being capacitor elements, each having a second capacitance value; said upper and lower rings being separated along a common axis;
    a plurality of said leg reactive elements comprising a first number of inductor elements disposed spatially from said axis and parallel therewith and coupling the upper and the low rings by interconnecting each said inductor element with a pair of adjacent capacitors in the upper ring and a corresponding pair of adjacent capacitors in the lower ring;
    an intermediate ring formed by said complementary reactive elements being a second number of inductor elements equals to the number of capacitor elements in the upper or lower ring;
    a set of diode elements disposed parallel to said axis, each said diode element having the same polarity and interconnecting the pair of adjacent capacitors in said lower ring with a corresponding pair of adjacent inductor elements in the intermediate ring; and
    means for switching said diodes between conductive and a non-conductive state, said conductive and non-conductive state causing to switch said NMR birdcage coil from the receive to the transmit mode.

5. The NMR birdcage coil of claim 4, wherein the means for switching said diodes comprises a bias supply coupled to the diode elements via said second number of inductor elements for activating and deactivating said diode elements between the conducting and non-conducting states.

6. The NMR birdcage coil of claim 5, further comprising a ring of parallel resonant circuits formed by coupling said capacitor elements in said low ring to corresponding inductor elements in said intermediate ring, wherein the coupling occurs due to a forward bias current passing through said diode elements, which makes them electrically RF conductive.

7. The NMR birdcage coil of claim 6, wherein frequencies of said parallel resonant circuits are tuned to an NMR frequency for increasing impedance within said cells and preventing current flow to the neighboring cells.

8. The NMR birdcage coil of claim 1, further comprising:
    an upper ring and a lower ring of periodically spaced, connected in series equal numbers of said reactive elements being inductor elements, each having the same inductance value, said upper and lower ring being separated along a common axis;

a set of periodically spaced and parallel to said axis said complementary reactive elements being capacitor elements, which interconnects adjacent inductors in the upper ring with corresponding adjacent inductors in the lower ring; and means for switching a mode of operation of said NMR birdcage coil from the transmit to the receive mode by providing an inductor element in parallel with one or more said complementary reactive element.

9. The NMR birdcage coil of claim 8, wherein said means for switching the mode of operation comprises a number of inductance elements equals to a number of capacitor elements, wherein each inductance element is switchably connected in parallel with each said capacitor element.

10. The NMR birdcage coil of claim 9, wherein the parallel combination of a said switchable inserted inductance and a said leg capacitor forms a circuit that resonates at the NMR frequency.

11. A method of switching a NMR birdcage coil between a transmit and a receive modes of operation, said NMR birdcage coil comprising a plurality of identical cells connected in a ladder pattern, each cell having an upper and a lower ring reactive elements interconnecting by a leg reactive element, comprising:

providing a complimentary reactive element to one or more reactive elements;

switchable connecting one of said cell reactive elements to the complimentary reactive element forming a parallel resonant circuit therewith; and switching the mode of operation of the birdcage coil from the transmit to the receive mode by tuning said parallel resonant circuit to a frequency of the NMR signals for forming a high impedance circuit and inactivating the birdcage coil.

12. The method of switching a NMR birdcage coil of claim 11, further comprising electrically coupling one of said cell reactive elements to the complimentary reactive element via PIN diodes; and electrically coupling the PIN diodes to a DC bias supply via RF choke coils.

13. The method of switching a NMR birdcage coil of claim 12, where switching the mode of operation further comprising: switching PIN diodes between electrically non-conducting and conducting states by switching voltage polarity of the DC bias supply.

14. The method of switching a NMR birdcage coil of claim 13, further comprising:

providing a high-pass birdcage coil with an upper and a lower ring comprising capacitor elements, and leg elements being inductor elements;

providing an intermediate ring formed by the complementary reactive elements comprising a number of inductor elements;

providing same polarity for the PIN diodes; and interconnecting via the PIN diode a pair of adjacent capacitors in a lower ring with a corresponding pair of adjacent inductor elements of said intermediate ring.

15. The method of switching a NMR birdcage coil of claim 13, further comprising:

providing a low-pass birdcage with an upper and a lower ring comprising inductor elements, and leg elements being capacitor elements;

interconnecting adjacent inductors in the upper ring with corresponding adjacent inductors in the lower ring by the complementary reactive elements being capacitor elements; and providing switchably an inductor element in parallel with each said capacitor element for switching a mode of operation of the birdcage coil.

* * * * *